United States Patent
Hsu (10) Patent No.: US 11,289,465 B2
(45) Date of Patent: Mar. 29, 2022

(54) DISPLAY DEVICE WITH LOW REFLECTIVITY METAL LAYER SURROUND A LIGHT EMITING UNIT OF A PIXEL

(71) Applicant: Innolux Corporation, Miao-Li County (TW)

(72) Inventor: Chia-Hsiu Hsu, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 16/910,031

(22) Filed: Jun. 23, 2020

(65) Prior Publication Data
US 2021/0020618 A1    Jan. 21, 2021

(30) Foreign Application Priority Data
Jul. 18, 2019 (CN) .......................... 201910649901.6

(51) Int. Cl.
| | | |
|---|---|---|
| *H01L 29/08* | (2006.01) | |
| *H01L 35/24* | (2006.01) | |
| *H01L 51/00* | (2006.01) | |
| *H01L 25/16* | (2006.01) | |

(52) U.S. Cl.
CPC .................. *H01L 25/167* (2013.01)

(58) Field of Classification Search
CPC ... H01L 25/167; H01L 25/0753; H01L 27/15; H01L 27/156; H01L 33/62; H01L 27/1218; H01L 27/3232; H01L 27/3244
See application file for complete search history.

(56) References Cited

U.S. PATENT DOCUMENTS

| | | | | |
|---|---|---|---|---|
| 2017/0133550 | A1* | 5/2017 | Schuele | H01L 33/0093 |
| 2017/0338212 | A1* | 11/2017 | Kuo | H01L 27/1225 |
| 2017/0358624 | A1 | 12/2017 | Takeya et al. | |
| 2018/0373366 | A1* | 12/2018 | Li | H01L 25/13 |
| 2019/0165040 | A1* | 5/2019 | Dupont | H01L 33/007 |
| 2020/0043906 | A1* | 2/2020 | Kuo | H01L 27/1225 |
| 2020/0058809 | A1* | 2/2020 | Mizuta | H01L 27/14632 |
| 2021/0159299 | A1* | 5/2021 | Wang | H01L 27/3272 |
| 2021/0202644 | A1* | 7/2021 | Wang | H01L 27/3265 |
| 2021/0202804 | A1* | 7/2021 | Sun | H01L 33/62 |

FOREIGN PATENT DOCUMENTS

| | | |
|---|---|---|
| CN | 108615740 | 10/2018 |
| CN | 109285856 | 1/2019 |

OTHER PUBLICATIONS

"Search Report of Europe Counterpart Application", dated Nov. 20, 2020, p. 1-p. 7.

* cited by examiner

*Primary Examiner* — Ismail A Muse
(74) *Attorney, Agent, or Firm* — JCIPRNET (57) ABSTRACT

A display device including a substrate and a plurality of pixels is provided. The pixels are disposed on the substrate. At least one of the pixels includes a thin film transistor, a bonding pad, a light emitting unit, and a metal layer. The bonding pad is electrically connected to the thin film transistor. The light emitting unit is disposed on the bonding pad. The metal layer is insulated from the bonding pad and surrounds the bonding pad in a top view direction of the display device.

19 Claims, 7 Drawing Sheets

DISPLAY DEVICE WITH LOW REFLECTIVITY METAL LAYER SURROUND A LIGHT EMITING UNIT OF A PIXEL

CROSS-REFERENCE TO RELATED APPLICATION

This application claims the priority benefit of China application serial no. 201910649901.6, filed on Jul. 18, 2019. The entirety of the above-mentioned patent application is hereby incorporated by reference herein and made a part of this specification.

BACKGROUND

Technical Field

The disclosure relates to an electronic device, and in particular, to a display device.

Description of Related Art

In current light emitting diode (LED) display devices, processes such as wafer bonding and laser lift off (LLO), etc. are required to transfer a plurality of light emitting units from a growth substrate to an active device array substrate. The active device array substrate is configured to control switching on and switching off actions of the light emitting units to mix lights, thereby providing a color display screen. During the LLO process, a laser beam may irradiate a thin film transistor in the active device array substrate, thus affecting electrical performance of the thin film transistor and reliability of the entire display device.

SUMMARY

The disclosure provides a display device with good reliability.

According to an embodiment of the disclosure, a display device includes a substrate and a plurality of pixels. The pixels are disposed on the substrate. At least one of the pixels includes a thin film transistor, a bonding pad, a light emitting unit, and a metal layer. The bonding pad is electrically connected to the thin film transistor. The light emitting unit is disposed on the bonding pad. The metal layer is insulated from the bonding pad and surrounds the bonding pad in a top view direction of the display device.

Based on the above, in one or more embodiments of the disclosure, the metal layer surrounds a periphery of the bonding pad. During an LLO process, the metal layer may prevent a laser beam from irradiating the thin film transistor, thereby maintaining electrical performance of the thin film transistor and reliability of the entire display device. In addition, reflective properties of the metal layer help increase light utilization.

In order to make the above features or advantages of the disclosure more obvious, the following embodiment is described in detail with reference to the accompanying drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

The directional terms mentioned in the detailed description, like "above", "below", "front", "back", "left", and "right", refer to the directions in the accompanying drawings. Therefore, the directional terms are used for illustration instead of limiting the disclosure. In the accompanying drawings, common features of a method, a structure and/or a material used in a specific embodiment are shown in the accompanying drawings. However, these accompanying drawings should not be construed as defining or limiting the scope or nature of these embodiments. For example, the relative sizes, thicknesses and positions of films, regions and/or structures may be reduced or enlarged for clarity.

In addition, repeated reference numerals or signs may be used in different embodiments, and such repetitions are merely used for simply and clearly describing the disclosure, and do not indicate a specific relationship between the different embodiments and/or structures discussed.

In addition, when an element or a film is referred to as being "on" another element or film or "connected to" another element or film, it may be directly on the another element or film or directly connected to the another element or film, or there are elements or films inserted between the two elements or films. When an element or a film is referred to as being "directly on" another element or film or "directly connected to" another element or film, there is no element or film inserted between the two elements or films.

In the detailed description, the same or similar reference numerals are used to indicate the same or similar elements, and details may be omitted in the description. In addition, the features in the embodiments may be used in any combination without departing from the spirit of the disclosure or conflicting with each other, and simple equivalent changes and modifications made to the specification or the claims shall still fall within the scope of the disclosure. In addition, the terms "first", "second", and the like mentioned in the specification or the claims are used to name discrete elements or to distinguish between different embodiments or ranges, but are not intended to define the upper or lower limit of the number of elements or the manufacturing or arrangement order of the elements.

Figure 1A:
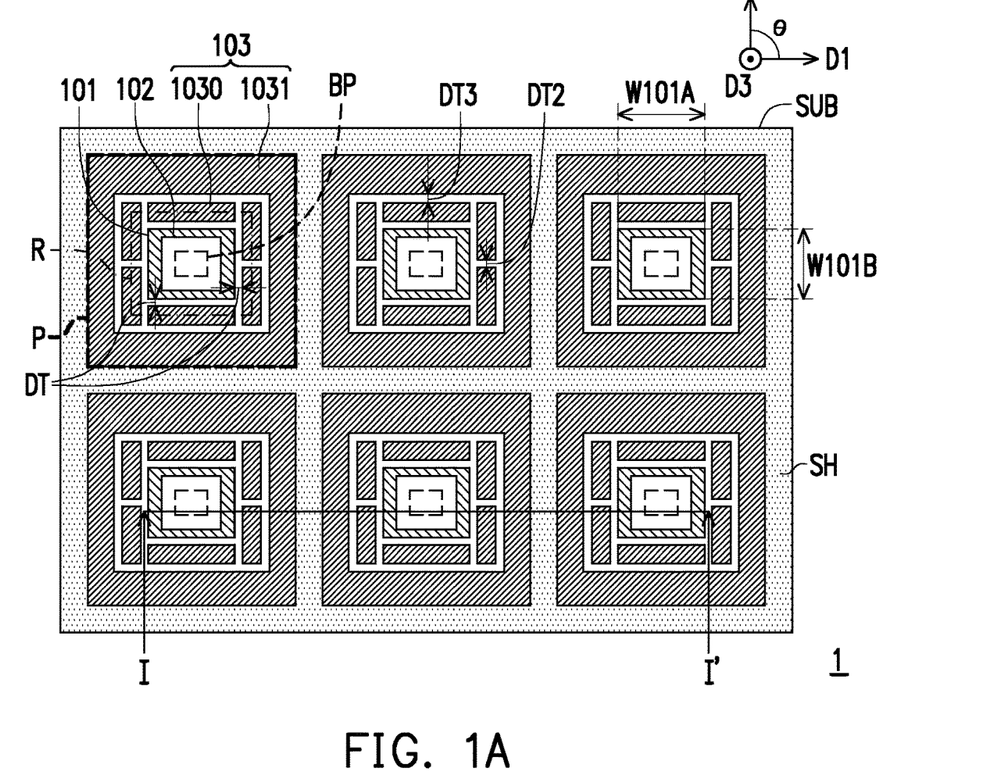
FIG. 1A is a schematic partial top view of a display device according to a first embodiment of the disclosure.
Figure 1B:
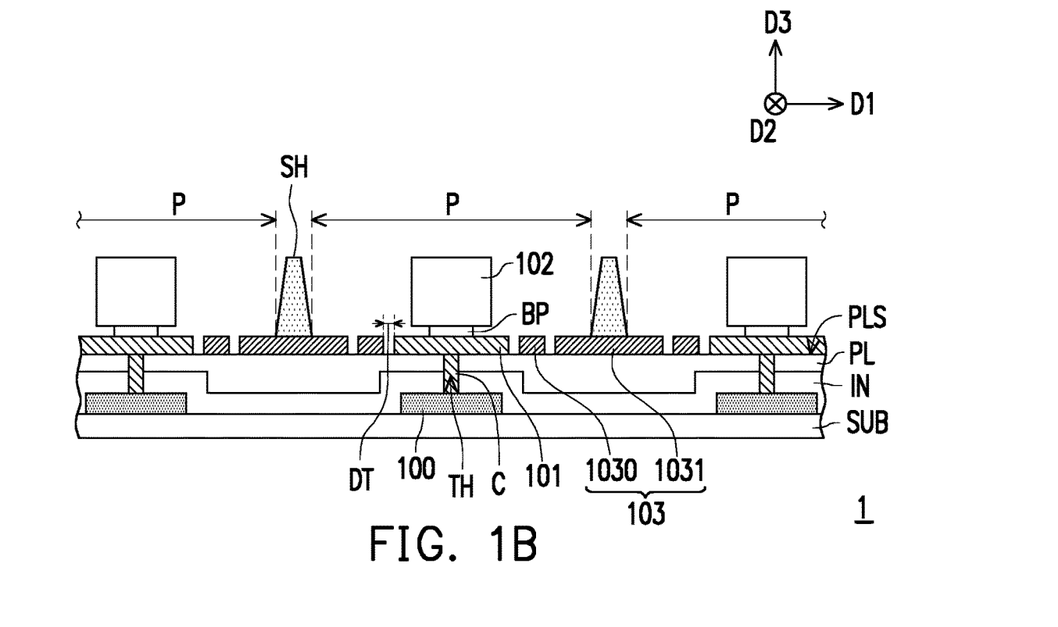
FIG. 1B is a schematic cross-sectional view taken along a sectional line I-I' in FIG. 1A.

FIG. 1A is a schematic partial top view of a display device 1 according to a first embodiment of the disclosure. FIG. 1B is a schematic cross-sectional view taken along a sectional line I-I' in FIG. 1A. With reference to FIG. 1A and FIG. 1B, the display device 1 includes a substrate SUB and a plurality of pixels P disposed on the substrate SUB. In FIG. 1A, one pixel P is indicated by thick dashed lines, and six pixels P are schematically shown. The six pixels P are arranged into a matrix along a first direction D1 and a second direction D2, respectively. The first direction D1 and the second direction D2 are, for example, perpendicular to each other, that is, an angle θ between the first direction D1 and the second direction D2 is 90 degrees. However, a number of the pixels P in the display device 1, a manner of arranging the pixels P, and a value of the angle θ may be changed as required without being limited to those shown in FIG. 1A and FIG. 1B.

The substrate SUB may be a rigid substrate or a flexible substrate. The substrate SUB may be made of a material suitable to form a substrate, including glass, polyimide (PI), polyethylene terephthalate (PET), etc. No limitation is imposed herein. In some embodiments of the disclosure, the display device 1 may be a flexible electronic device (flexible display), a touch electronic device (touch display), a curved electronic device (curved display), or a non-rectangular electronic device (free shape display). However, the disclosure is not limited thereto. In addition, the electronic device may include a display device, a sensing device, or a splicing device, but the disclosure is not limited thereto. The electronic device may be a bendable or flexible electronic device. The electronic device may include, for example, an LED. The light emitting diode may include, for example, an organic LED (OLED), a mini LED, a micro LED, or a quantum dot (quantum dot, QD) LED (for example, a QLED or a QDLED), fluorescence, phosphor or other suitable materials that may be arranged and combined at random. However, the disclosure is not limited thereto. The electronic device 1 may be a splicing device, such as a display splicing device, but the disclosure is not limited thereto. It should be noted that the electronic device 1 may be any combination of the above, but the disclosure is not limited thereto. Contents of the disclosure are described below using that the electronic device 1 serves a display device or a splicing device, but the disclosure is not limited thereto.

At least one of the pixels P includes a thin film transistor 100, a bonding pad 101, a light emitting unit 102, and a metal layer 103. In the present embodiment, each of the pixels P includes a thin film transistor 100, a bonding pad 101, a light emitting unit 102, and a metal layer 103, but the disclosure is not limited thereto. In another embodiment, the pixels P may have different structures. For example, at least one of the pixels P may include a thin film transistor 100, a bonding pad 101, and a light emitting unit 102 but not a metal layer 103.

The thin film transistor 100 is disposed on the substrate SUB. In particular, the thin film transistor 100 may be directly disposed on and in contact with the substrate SUB. Alternatively, the thin film transistor 100 may be indirectly disposed on the substrate SUB and not in contact with the substrate SUB. For example, another film layer (not shown) may be formed on the substrate SUB before the thin film transistor 100 is formed.

The thin film transistor 100 is adapted to control on/off of the light emitting unit 102 (emits a light or does not emit a light). In the present embodiment, the thin film transistor 100 may be a thin film transistor of any known type, such as an amorphous silicon (a-Si) thin film transistor, a hydrogenated amorphous silicon (a-Si: H) thin film transistor, an oxide thin film transistor, or a metal oxide thin film transistor, or poly silicon (poly-Si) thin film transistor, etc.

The bonding pad 101 is electrically connected to the thin film transistor 100. FIG. 1B schematically shows one of methods/architectures for electrically connecting the bonding pad 101 and the thin film transistor 100. However, the method/architecture for electrically connecting the bonding pad 101 and the thin film transistor 100 is not limited to that shown in FIG. 1B. The bonding pad 101 may be a reflective electrode, a transparent electrode, or a translucent electrode. The reflective electrode may be made of a material such as argentum (Ag), germanium (Ge), aluminum (Al), copper (Cu), molybdenum (Mo), titanium (Ti), tin (Sn), chromium (Cr), aluminum alloy (such as AlNd or ACX), or APC alloy (argentum-palladium-copper alloy), etc. The transparent electrode may be a transparent oxide electrode (Transparent Conducting Oxide, TCO electrode), such as an ITO electrode or an IZO electrode. The translucent electrode may be a metal thin film electrode, such as a magnesium-argentum alloy thin film electrode, a gold thin film electrode, a platinum thin film electrode, an aluminum thin film electrode, etc.

As shown in FIG. 1B, one or more elements/film layers may be disposed between the bonding pad 101 and the thin film transistor 100. For example, the display device 1 may further include an insulating layer IN and a planar layer PL. The insulating layer IN and the planar layer PL are located between the bonding pad 101 and the thin film transistor 100. The insulating layer IN is disposed on the thin film transistors 100 and the substrate SUB, and the planar layer PL is disposed on the insulating layer IN. The planar layer PL is adapted to provide a relatively planar surface to facilitate subsequent fabrication of an element (such as the bonding pad 101 and the metal layer 103). The bonding pad 101 is disposed on the planar layer PL and is located above the thin film transistor 100. A through hole TH that penetrates through the insulating layer IN and the planar layer PL may be formed between the bonding pad 101 and the thin film transistor 100 located below the bonding pad 101. The through hole TH may be filled with a conductive member C. The bonding pad 101 may be electrically connected to the thin film transistor 100 located below the bonding pad through the conductive member C. In practice, the bonding pad 101 and the conductive member C may be formed simultaneously or separately. When to be formed simultaneously, the bonding pad 101 and the conductive member C are made of a same material. When to be formed separately, the bonding pad 101 and the conductive member C may be made of a same material or different materials.

The light emitting unit 102 is disposed on the bonding pad 101. For example, the light emitting unit 102 may be electrically connected to the bonding pad 101 through a conductive bump BP. In this architecture, the thin film transistor 100 may be electrically connected to the light emitting unit 102 through the conductive bump BP, the bonding pad 101, and the conductive member C. Therefore, the thin film transistor 100 may control switching on and switching off actions of the light emitting unit 102. The conductive bump BP may be made materials including gold (Au), indium (In), tin (Sn), nickel (Ni), aluminum (Al), platinum (Pt), titanium (Ti), lead (Pb), argentum (Ag), or alloy thereof or other frequently used metal welding materials. The light emitting unit 102 may include an organic LED (OLED) module, a quantum dot (QD) LED (QDLED) module, and an LED module. The diodes may include a micro LED or a mini LED according to a size. The mini LED may have a size about 100 μm to 300 μm, and the micro LED may have a size about 1 μm to 100 μm, but the disclosure is not limited thereto.

The metal layer 103 is insulated from the bonding pad 101. The metal layer 103 surrounds the bonding pad 101 in a top view direction D3 of the display device 1 (refer to FIG. 1A). The insulation between the metal layer 103 and the bonding pad 101 means that the metal layer 103 and the bonding pad 101 are separated (not in contact with each other). In addition, that the metal layer 103 surrounds the bonding pad 101 in the top view direction D3 of the display device 1 means that when the display device 1 is being viewed from the top view direction D3 (for example, in a top view of the display device 1), the metal layer 103 is disposed along a periphery of the bonding pad 101. The metal layer 103 surrounding the bonding pad 101 may form at least one non-closed ring and/or closed ring. In the present embodiment, the metal layer 103 may form a non-closed ring R.

FIG. 1A and FIG. 1B schematically show an example in which the entire metal layer 103 is separated from the bonding pad 101 and the metal layer 103 forms a non-closed ring and a closed ring. In FIG. 1A and FIG. 1B, the metal layer 103 and the bonding pad 101 are formed in a same layer. In other words, the metal layer 103 and the bonding pad 101 may be in contact with a same upper surface (for example, an upper surface PLS of the planar layer PL), and the metal layer 103 and the bonding pad 101 may be formed through a same manufacturing step and made of a same material. However, the disclosure is not limited thereto. In another embodiment, the metal layer 103 and the bonding pad 101 may be disposed on a same upper surface, and the metal layer 103 and the bonding pad 101 may be formed through different manufacturing steps and/or made of different materials. Alternatively, the metal layer 103 and the bonding pad 101 may be formed in different layers. In other words, the metal layer 103 and the bonding pad 101 may be formed through different manufacturing steps and/or made of different materials and may be disposed on different upper surfaces, respectively. The metal layer 103 may be made of argentum (Ag), germanium (Ge), aluminum (Al), copper (Cu), molybdenum (Mo), titanium (Ti), tin (Sn), chromium (Cr), aluminum alloy (such as AlNd or ACX), or APC alloy (argentum-palladium-copper alloy), but the disclosure is not limited thereto.

The metal layer 103 may include a plurality of separated metal members 1030. The separated metal members 1030 are adjacent to and insulated from the bonding pad 101. In addition, the separated metal members 1030 may be arranged with the light emitting unit 102 as a center to form at least one ring. When the separated metal members 1030 are arranged into a plurality of rings, the rings may be arranged into a plurality of concentric rings with the light emitting unit 102 as a center. FIG. 1A schematically shows that the separated metal members 1030 are arranged into a quadrangle non-closed ring R. However, a ring number and/or shape may be changed as required without being limited thereto. For example, the ring may also have a circular shape, an elliptical shape, other polygonal shapes or irregular shapes.

The separated metal members 1030 may substantially have a same shape. For example, all of the separated metal members 1030 may substantially have a quadrangular shape, a circular shape, an elliptical shape, other polygonal shapes or irregular shapes. For example, as long as all of the shapes substantially have a quadrangular shape, a possible slight difference of uneven edges of the quadrangle may be ignored. FIG. 1A schematically shows that all of the separated metal members 1030 are a rectangle. In the present embodiment, each rectangle is arranged along a periphery of the light emitting unit 102, that is, a length side of the rectangle is substantially parallel to an edge of the light emitting unit 102 adjacent to the rectangle. "Substantially parallel" means that an included angle between the length side of the rectangle and a corresponding edge of the light emitting unit 102 may fall within a range of 0 degrees to 5 degrees. In other words, the angle is greater than or equal to 0 degrees and less than or equal to 5 degrees. In another embodiment, at least some of the separated metal members 1030 may have different shapes. For example, the separated metal members 1030 may have at least two shapes of a quadrangle, a circle, an ellipse, other polygons, and an irregular shape. Furthermore, regardless of whether the shapes are the same, the separates metal members 1030 may have a same size or have at least partially different sizes. The size refers to an area of the bottom of the metal member 1030 when the display device 1 is viewed from the top view direction D3. The area refers to an area of a bottom of a specific element when the display device 1 is viewed in the top view direction D3.

In the present embodiment, the metal layer 103 may selectively include a peripheral metal member 1031. The peripheral metal member 1031 is adjacent to and separated from the separated metal members 1030. In addition, in the present embodiment, the peripheral metal member 1031 surrounds the separated metal members 1030, so that the separated metal members 1030 are located between the peripheral metal member 1031 and the bonding pad 101, and the peripheral metal member 1031 continuously forms a closed ring. In addition, peripheral metal members 1031 in adjacent pixels P may be connected to each other, but the disclosure is not limited thereto.

It is worth noting that if an alignment error occurs during transfer of the light emitting unit 102, the light emitting unit 102 may be in contact with both the metal layer 103 and the bonding pad 101. In this case, a plurality of adjacent light emitting units 102 may be short-circuited. Therefore, when the bonding pad 101 and the metal layer 103 are in a same layer, there is a distance DT between the metal layer 103 (for example, the metal member 1030) closest to the bonding pad 101 and the bonding pad, helping prevent adjacent light emitting units 102 from being short-circuited as a result of an alignment error, a process error, or other factors. The distance DT may be a minimum distance in the first direction D1 or the second direction D2. In consideration of electrical properties and light shielding, etc., the distance DT between the metal layer 103 (for example, the metal member 1030) and the bonding pad 101 ranges, for example, from 1 micrometer (μm) to 30 μm, that is, 1 μm≤DT≤30 μm, but the disclosure is not limited thereto. When the distance DT is greater than or equal to 1 the conductive bump BP1 of the light emitting unit 102 is prevented from being in contact with both the metal layer 103 and the bonding pad 101 due to an alignment error. In addition, when the distance DT is less than or equal to 30 μm, the metal layer 103 may effectively prevent a laser beam from irradiating the thin film transistor 100.

In addition, the separated metal members 1030 may discontinuously form a ring. There may be a distance DT2 between two adjacent metal members 1030, and there is a distance DT3 between the metal member 1030 and the peripheral metal member 1031. The distance DT2 and the distance DT3 may be adjusted according to a design.

The display device 1 may further include a light shielding pattern SH. The light shielding pattern SH is made of a light shielding material (for example, a light absorbing material). The light shielding material may be black resin or black ink, but the disclosure is not limited thereto. The light shielding pattern SH is disposed on the substrate SUB and surrounds the pixels P, thereby defining a shape, a range, and an area of each pixel P. FIG. 1A schematically shows that the light shielding pattern SH forms a plurality of closed frames. The frame has a quadrangular shape. However, the frame may also be a circle or other polygons without being limited to that shown in FIG. 1A. In addition, a corner of the frame may have an arch shape or other shapes. In addition, a cross-section of the shielding pattern may be a quadrangle (also referred to as a trapezoid) with a smaller upper width and a larger lower width. A range of the pixel P may be defined by the lower bottom of the light shielding pattern SH. In a top view, the range of the pixel P is defined by a boundary (for, example, a thick dashed lines) of the light shielding pattern SH. When the peripheral metal members 1031 in the adjacent pixels P are connected to each other, the light shielding pattern SH may be disposed on the peripheral metal member 1031. In an embodiment, the peripheral metal members 1031 in the adjacent pixels P may be separated from each other. In this case, the light shielding pattern SH may be disposed on the planar layer PL and located between two peripheral metal members 1031 in two adjacent pixels P.

A reflectance of the metal layer 103 depends on use scope of the display device 1. The metal layer 103 may be configured to shield an external light transmitted toward the substrate SUB to reduce influence of the external light on other layers under the metal layer 103. For example, the metal layer 103 has a reflection characteristic (for example, a reflectance greater than 10%) for a laser source selected in an LLO process, so that the metal layer 103 may be configured to shield a laser beam. During the LLO process, the metal layer 103 may prevent a laser beam from irradiating the thin film transistor 100, thereby maintaining electrical performance of the thin film transistor 100 and reliability of the entire display device 1. Normal electrical performance means that a variation of an electrical parameter is less than 50%. The electrical parameter may include a resistance, a mobility, a leakage current (±10 volts), a capacitance, or a threshold voltage, etc.

The metal layer 103 may also help increase light utilization. For example, when the display device 1 is mainly used in a non-high ambient light environment, the metal layer 103 may be made of a material with a specific reflectance (for example, a reflectance greater than 30%). The metal layer reflects a light emitted from the light emitting unit 102 to the substrate SUB, to increases a brightness of the display device 1.

The metal layer 103 may also avoid a decrease in resolution. For example, when the display device 1 is mainly used in a high ambient light environment (for example, an outdoor environment), the metal layer 103 may be made of a material with a specific reflectance (for example, a reflectance less than 30%). The material with the reflectance less than 30% may include chromium (C), molybdenum (Mo), titanium (Ti), or manganese (Mn), but the disclosure is not limited thereto. The reflectance may be measured, for example, using an incident light (such as a laser beam in an LLO process) with a specific wavelength or wavelength range and a sample for manufacturing a same metal film layer, that is, the reflectance may be obtained by a device by measuring the incident light a reflected light. The reflectance herein refers to a reflectance of the metal layer 103 for a light beam in the LLO process. Because LLO may be performed on lasers with a plurality of wavelengths (that is, a laser wavelength may be selected), metal layers made of a same material have different reflectivities for lasers with different wavelengths. Therefore, the material of the metal layer 103 may be selected according to a wavelength of a light beam in the LLO process.

Figure 2A:
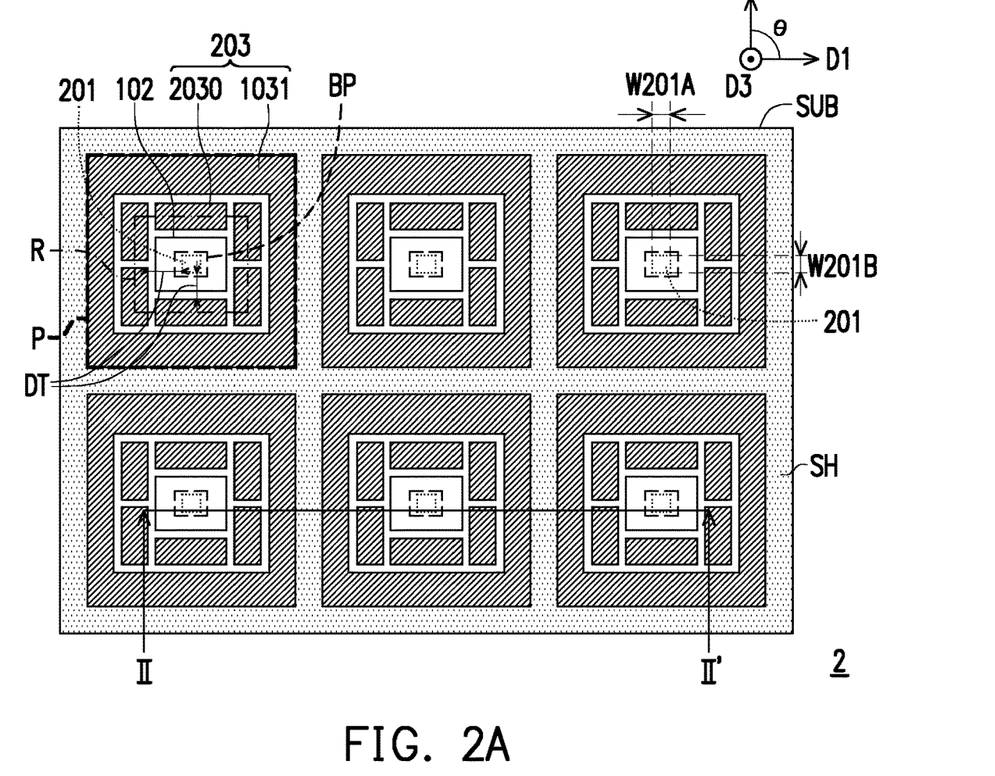
FIG. 2A is a schematic partial top view of a display device according to a second embodiment of the disclosure.
Figure 2B:
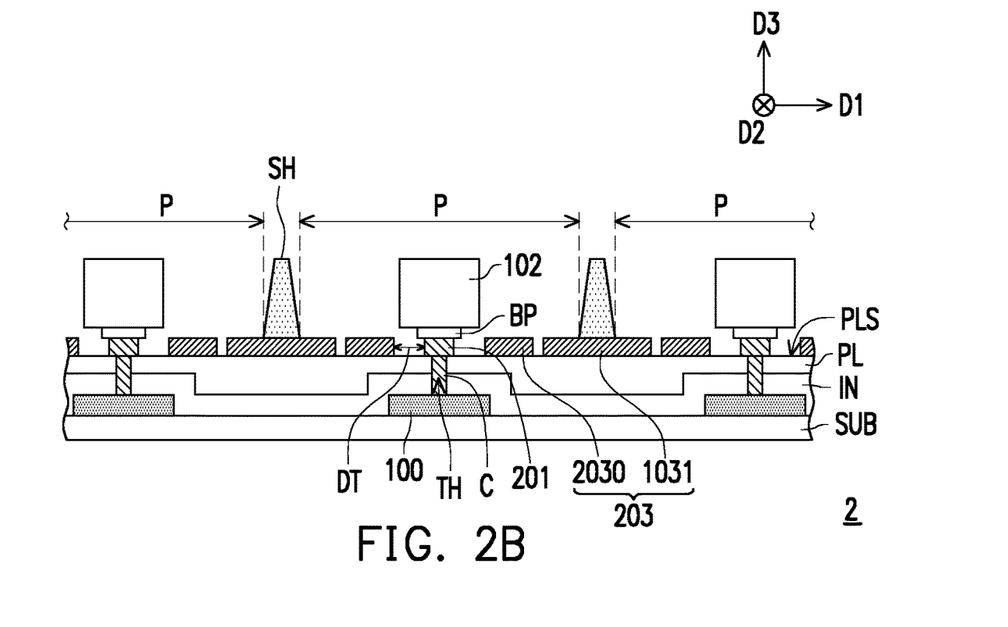
FIG. 2B is a schematic cross-sectional view taken along a sectional line II-II' in FIG. 2A.
Figure 3:
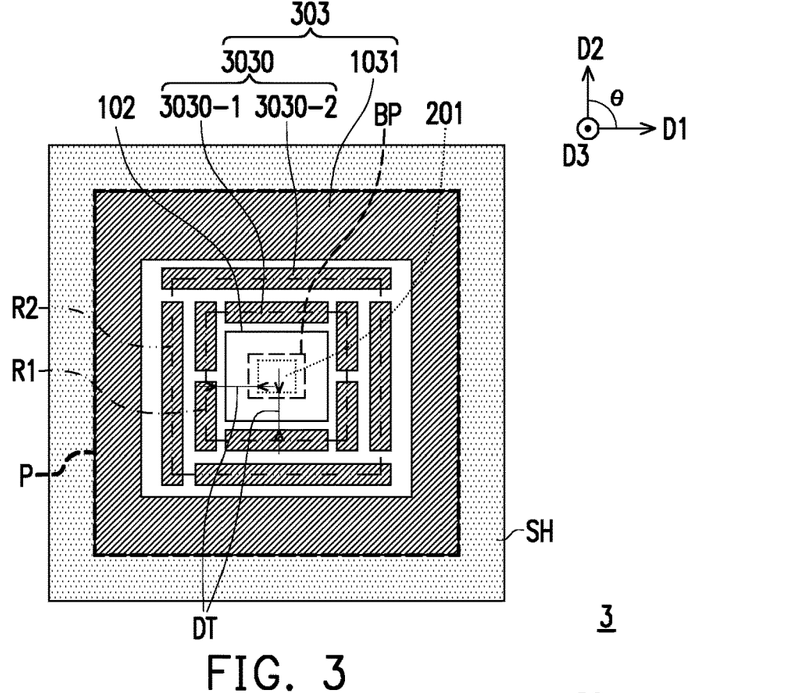
FIG. 3 and FIG. 4 are schematic partial top views of display devices according to a third embodiment and a fourth embodiment of the disclosure, respectively.
Figure 4:
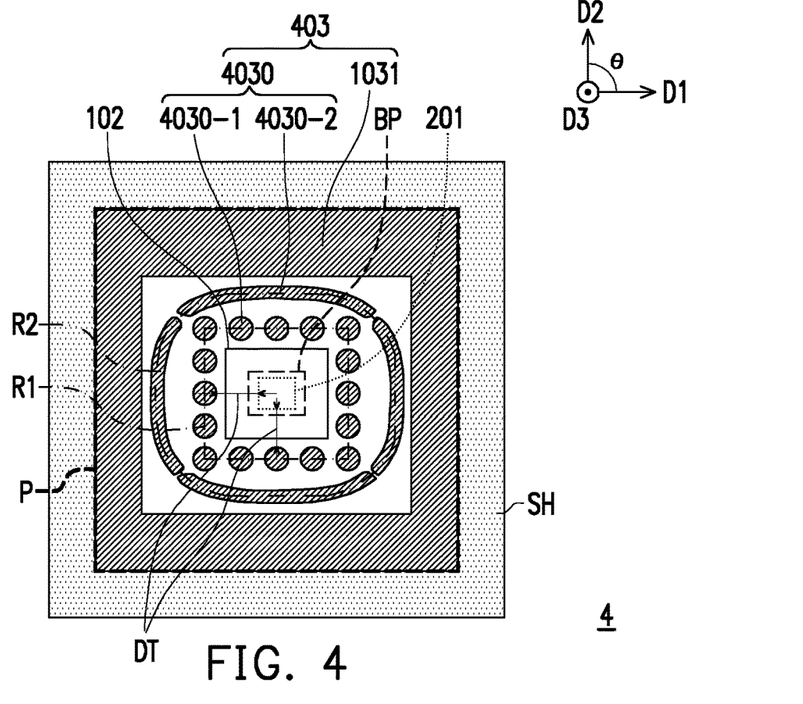
Figure 5:
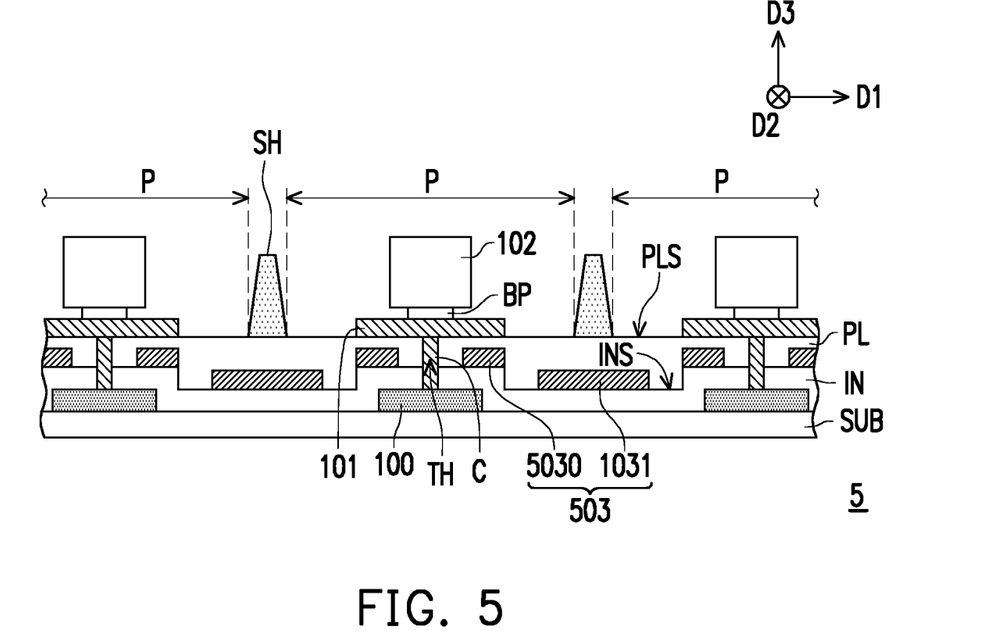
FIG. 5 is a schematic partial cross-sectional view of a display device according to a fifth embodiment of the disclosure.
Figure 6A:
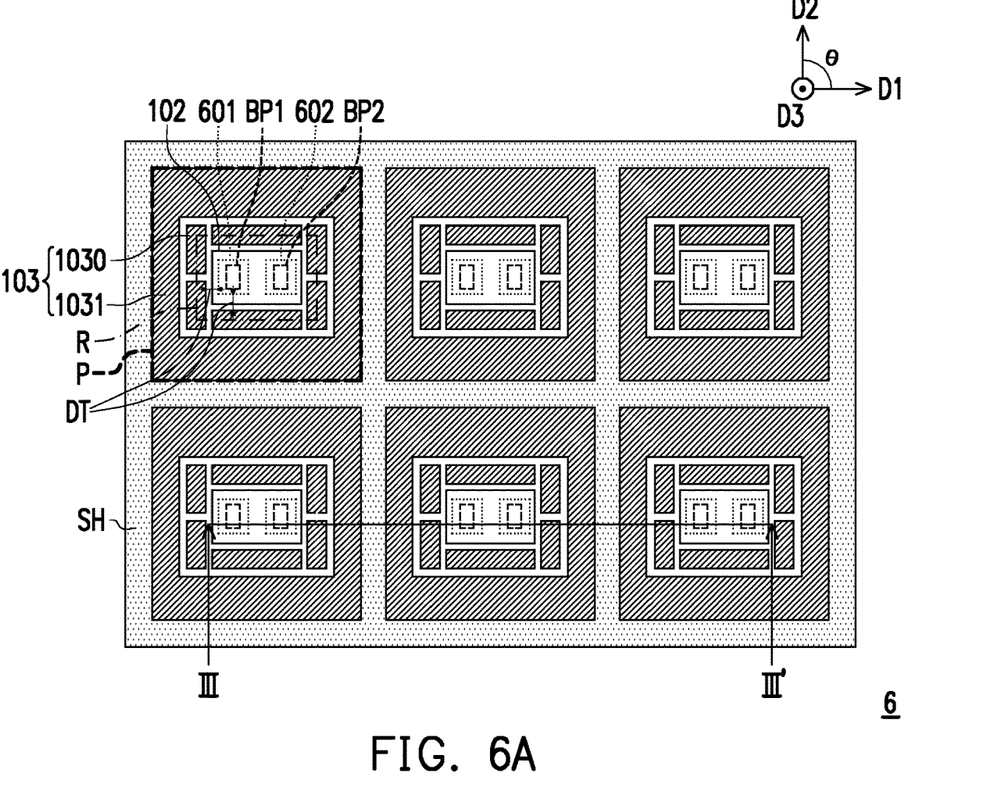
FIG. 6A is a schematic partial top view of a display device according to a sixth embodiment of the disclosure.
Figure 6B:
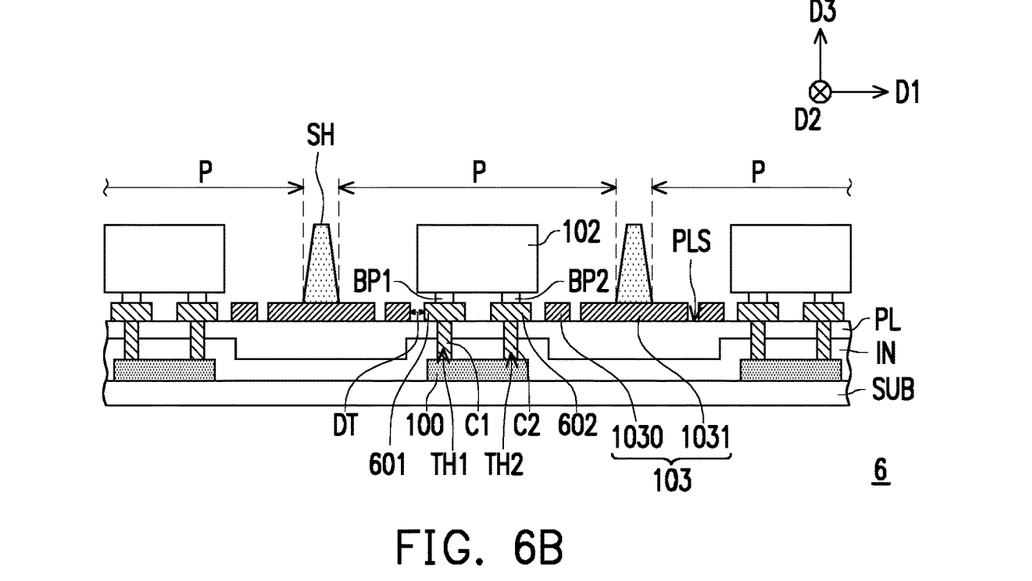
FIG. 6B is a schematic cross-sectional view taken along a sectional line in FIG. 6A.

Other embodiments of the display device of the disclosure are described below with reference to FIG. 2A to FIG. 10. However, implementations of the display device of the disclosure are not limited to the following description. FIG. 2A is a schematic partial top view of a display device 2 according to a second embodiment of the disclosure. FIG. 2B is a schematic cross-sectional view taken along a sectional line in FIG. 2A. FIG. 3 and FIG. 4 are schematic partial top views of a display device 3 and a display device 4 according to a third embodiment and a fourth embodiment of the disclosure, respectively. FIG. 5 is a schematic partial cross-sectional view of a display device 5 according to a fifth embodiment of the disclosure. FIG. 6A is a schematic partial top view of a display device 6 according to a sixth embodiment of the disclosure. FIG. 6B is a schematic cross-sectional view taken along a sectional line in FIG. 6A. FIG. 7 to FIG. 10 are schematic partial top views of a display device 7 to a display device 10 according to a seventh embodiment to a tenth embodiment of the disclosure, respectively. In order to clearly show a relative arrangement relationship among a plurality of elements, one pixel P is schematically shown in FIG. 3, FIG. 4, and FIG. 7 to FIG. 10. In addition, cross-sectional views of FIG. 3 and FIG. 4 are similar to the cross-sectional view of FIG. 2B, and cross-sectional views of FIG. 7 to FIG. 10 are similar to the cross-sectional view of FIG. 6B. A main difference lies in a distance between elements and sizes of the elements. Therefore, the cross-sectional views of FIG. 3, FIG. 4 and FIG. 7 to FIG. 10 are not shown.

With reference to FIG. 2A and FIG. 2B, main differences between a display device 2 and the display device 1 in FIG. 1A and FIG. 1B are as follows. In the display device 2, an area of a bonding pad 201 is less than an area of the bonding pad 101. In an example of FIG. 2A, the area of the bonding pad 201 may be a product of a width W201A of the bonding pad 201 in a first direction D1 and a width W201B of the bonding pad 201 in a second direction D2. The area of the bonding pad may be reduced through a reduction of the width W201A of the bonding pad 201 in the first direction D1 and/or the width W201B of the bonding pad 201 in the second direction D2. In particular, when the bonding pad 201 and a metal layer 203 are in a same layer (for example, both the metal layer 103 and the bonding pad 101 are in contact with the upper surface PLS of the planar layer PL), a space between the bonding pad 201 and a peripheral metal member 1031 changes, and therefore a total area of metal members 2030 may be adjusted according to a design. In the previous embodiment, as shown in FIG. 1A, the widths W101A and W101B are greater than a width of the light emitting unit 102 in the same direction. In the present embodiment, as shown in FIG. 2A, the widths W201A and W201B are less than the width of the light emitting unit 102 in the same direction. In the present embodiment, the total area of the metal members 2030 is greater than a total area of the metal members 1030 in the previous embodiment. In other embodiments, the width W201A and width W201B of the bonding pad 201 may be the same as the width of the light emitting unit 102 in the same direction. No limitation is imposed herein. A layout space on the planar layer PL increases as the area of the bonding pad 201 decreases. Therefore, areas of a plurality of separated metal members 2030 may be increased (for example, widths of the metal members 2030 in the first direction D1 and/or the second direction D2 are increased) to further improve a light shielding effect and light utilization. The area refers to an area of a bottom of an element when viewed from a top view direction D3. With reference to FIG. 3, main differences between a display device 3 and the display device 2 in FIG. 2A and FIG. 2B are as follows. In the display device 3, a plurality of separated metal members 3030 (including a plurality of separated metal members 3030-1 and a plurality of separated metal members 3030-2) in a metal layer 303 are arranged into a concentric ring consisting of a plurality of rings (such as a ring R1 and a ring R2) with a light emitting unit 102 as a center. The separated metal members 3030-1 are arranged into a ring R1, and the separated metal members 3030-2 are arranged into a ring R2. The ring R2 is located between the ring R1 and a peripheral metal member 1031. In the display device 3, the separated metal members 3030-1 and the separated metal members 3030-2 have substantially a same shape, such as a rectangle, but the disclosure is not limited thereto. In the specification, a shape of an element refers to a shape of the element when viewed from a top view direction D3. That a plurality of elements have a same shape means that the elements have a same or similar appearance (for example, all of the elements are a rectangle, a circle, an ellipse, or other polygons) when viewed from the top view direction D3. However, the elements neither necessarily have a same side length in a same direction, nor necessarily have a same size, and may include a measurement error.

With reference to FIG. 4, main differences between a display device 4 and the display device 3 in FIG. 3 are as follows. In the display device 4, at least some of a plurality of separated metal members 4030 in a metal layer 403 have different shapes, such as a circular shape and a curved strip shape. A plurality of circular metal members 4030-1 are arranged into a non-closed ring R1, and a plurality of metal members 4030-2 with a curved strip shape are arranged into a non-closed ring R2. In the specification, a shape of an element refers to a shape of the element when viewed from a top view direction D3. That a plurality of elements have different shapes means that the elements have different or unlike appearances (for example, the metal members 4030-1 of the ring R1 have a circular shape, and the metal members 4030-2 of the ring R2 have a curved strip shape) when viewed from the top view direction D3. However, the disclosure is not limited to the shapes in the embodiment.

With reference to FIG. 5, main differences between a display device 5 and the display device 1 in FIG. 1A and FIG. 1B are as follows. In the display device 5, a metal layer 503 and a bonding pad 101 are formed in different layers. In particular, the metal layer 503 may be in contact with an upper surface INS of an insulating layer IN, and the bonding pad 101 may be in contact with an upper surface PLS of a planar layer PL. In the present embodiment, the planar layer PL is disposed on the insulating layer IN, a peripheral metal member 1031, and a plurality of separated metal members 5030. The metal member 5030 is located at least partially below the bonding pad 101, which means that the bonding pad 101 and the metal member 5030 may partially overlap when viewed from a top view direction D3. In addition, the metal member 5030 and the bonding pad 101 are insulated from each other through the planar layer PL.

With reference to FIG. 6A and FIG. 6B, main differences between a display device 6 and the display device 1 in FIG. 1A and FIG. 1B are as follows. In the display device 6, each pixel P may include two bonding pads (for example, a bonding pad 601 and a bonding pad 602). The bonding pad 601 and the bonding pad 602 are electrically connected to a thin film transistor 100 through a conductive member C1 located in a through hole TH1 and a conductive member C2 located in a through hole TH2, respectively. In addition, the light emitting unit 102 may be electrically connected to the bonding pad 601 and the bonding pad 602 through a conductive bump BP1 and a conductive bump BP2, respectively.

Figure 7:
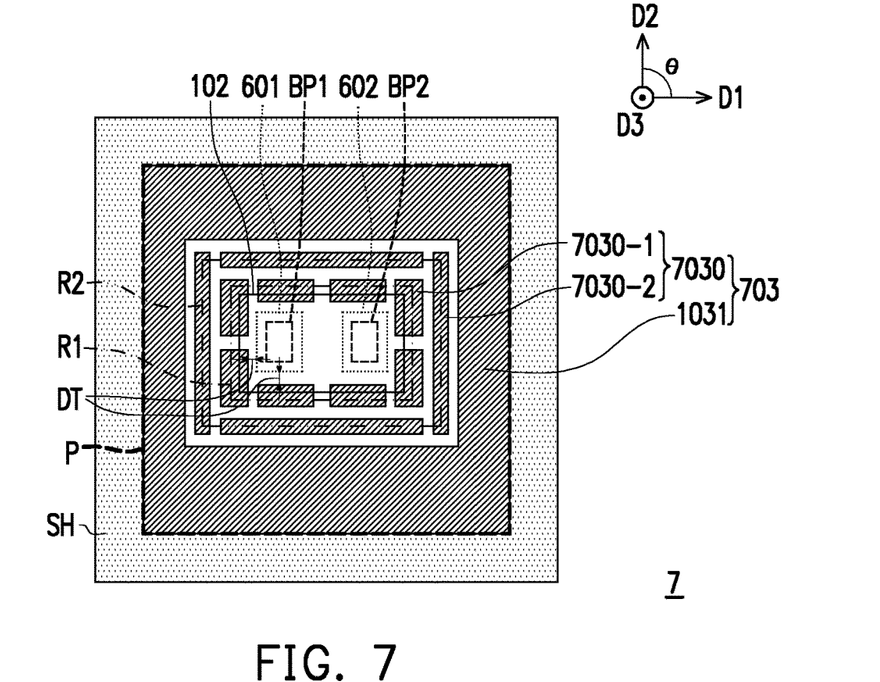
FIG. 7 to FIG. 10 are schematic partial top views of display devices according to a seventh embodiment to a tenth embodiment of the disclosure, respectively.

With reference to FIG. 7, main differences between a display device 7 and the display device 6 in FIG. 6A and FIG. 6B are as follows. In the display device 7, a plurality of separated metal members 7030 in a metal layer 703 are arranged into a concentric ring consisting of a plurality of rings (such as a ring R1 and a ring R2) with a light emitting unit 102 as a center. A plurality of separated metal members 7030-1 are arranged into a ring R1, and a plurality of separated metal members 7030-2 are arranged into a ring R2. The ring R2 is located between the ring R1 and a peripheral metal member 1031. In addition, with reference to FIG. 6B and FIG. 7, a part of each metal member 7030-1 in the ring R1 may extend to a position below the light emitting unit 102, so that each metal member 7030-1 in the ring R1 partially overlaps the light emitting unit 102. In the display device 7, the separated metal members 7030-1 and the separated metal members 7030-2 may have a same shape, such as a rectangle. In order to clearly show a relative disposing relationship between the metal member 7030-1 and the light emitting unit 102, a part of the metal member 7030-1 that is shielded by the light emitting unit 102 is shown by a solid line in FIG. 7, and so on in FIG. 8 and FIG. 9. The descriptions thereof are omitted below.

Figure 8:
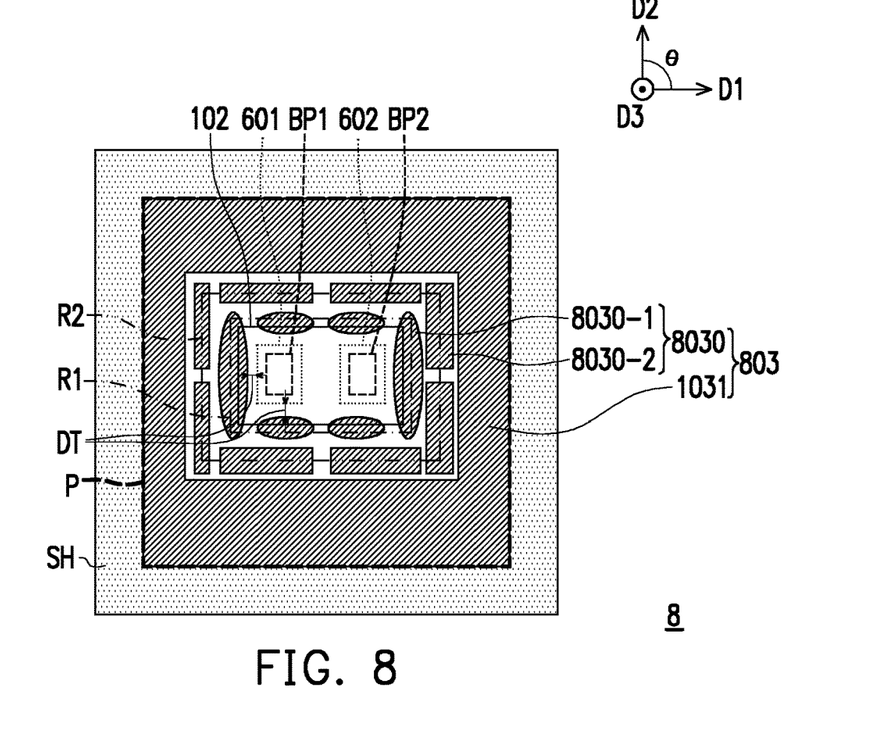

With reference to FIG. 8, main differences between a display device 8 and the display device 7 in FIG. 7 are as follows. In the display device 8, at least some of a plurality of separated metal members 8030 in a metal layer 803 have different shapes, such as an elliptical shape and a rectangular shape. A plurality of elliptical metal members 8030-1 are arranged into a non-closed ring R1, and a plurality of rectangular metal members 8030-2 are arranged into a non-closed ring R2. No limitation is imposed herein.

Figure 9:
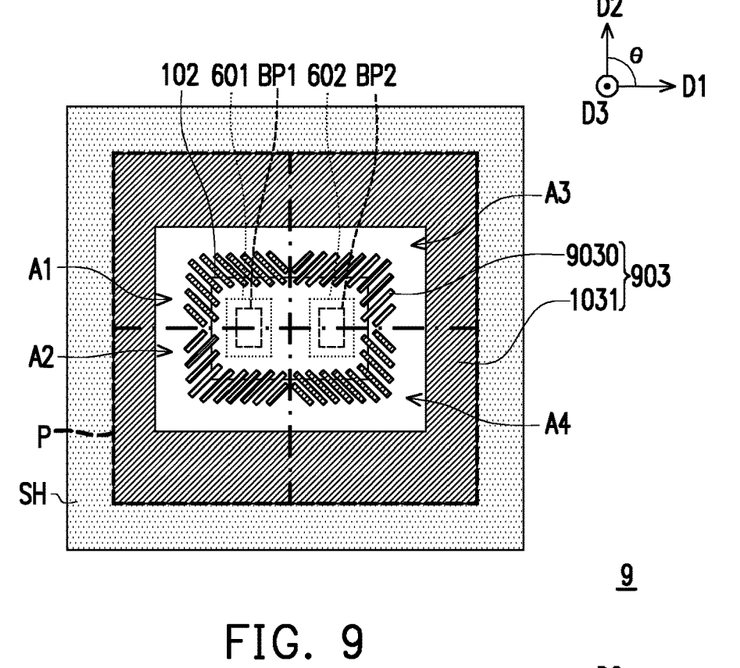

With reference to FIG. 9, main differences between a display device 9 and the display device 6 in FIG. 6A and FIG. 6B are as follows. In the display device 9, a pixel P may be divided into a plurality of regions with a light emitting unit 102 as a center, as long as an intersection among the regions is within a range of the light emitting unit 102. A number of the regions may be changed as required, or may be any positive integer. FIG. 9 schematically shows four regions, for example, a region A1 to a region A4 with a same region divided by a plurality of dot-dashed lines with the light emitting unit 102 as a center according to a direction in which the metal member 9030 extends. An intersection among the region A1, the region A2, the region A3, and the region A4 is located within a range of the light emitting unit 102 and is adjacent to or overlaps a geometric center of the light emitting unit 102. However, numbers, areas, and/or shapes of the regions are not limited to those shown in FIG. 9, as long as the intersection among the regions is within the range of the light emitting unit 102.

The separated metal members 9030 of a metal layer 903 are located in the region A1 to the region A4 and extend inward with the light emitting unit 102 as a center. All metal members 9030 located in a same region are substantially parallel, that is, an acute angle between extending directions of two adjacent metal members 9030 located in a same region is less than 10 degrees. For example, when the display device 9 is viewed from a top view direction D3 (shown in the figure), all of the metal members 9030 located in the region A1 extend from an upper left position to a lower right position, respectively; all of the metal members 9030 located in the region A2 extend from a lower left position to an upper right position, respectively; all of the metal members 9030 located in the region A3 extend from an upper right position to a lower left position, respectively; and all of the metal members 9030 located in the region A4 extend from a lower right position to an upper left position, respectively, thereby improving optical characteristics (for example, light diffusion effect). However, an arrangement of the metal members 9030 in each region is not limited thereto.

Figure 10:
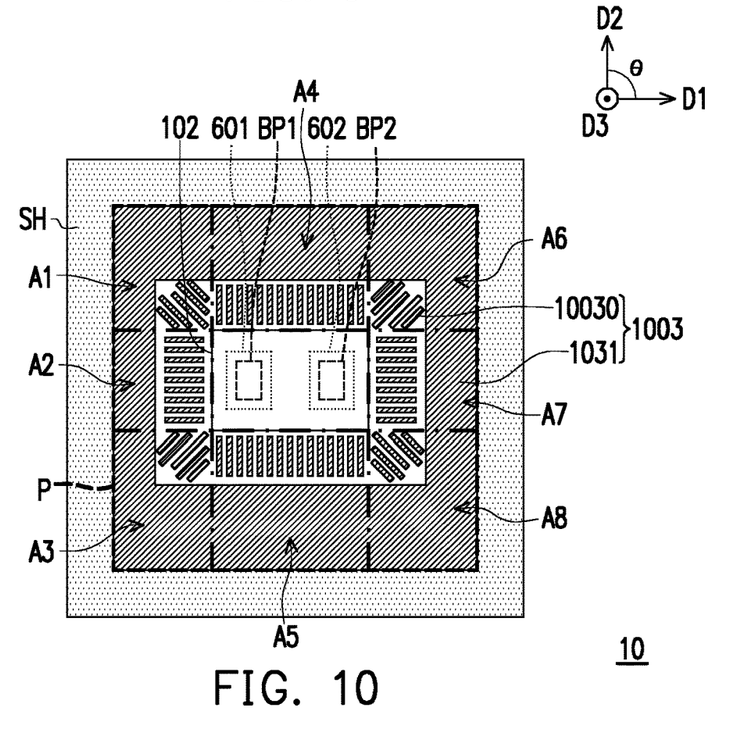

With reference to FIG. 10, main differences between a display device 10 and the display device 9 in FIG. 9 are as follows. In the display device 10, a pixel P may be divided into eight regions, for example, a region A1 to a region A8 by a plurality of dot-dashed lines with the light emitting unit 102 as a center according to a direction in which a metal member 10030 extends. However, numbers, areas, and/or shapes of the regions are not limited to those shown in FIG. 10. The separated metal members 10030 of a metal layer 1003 are located in the region A1 to the region A8 and extend inward with the light emitting unit 102 as a center. All metal members 10030 located in a same region extend in a same direction. For example, when the display device 1 is viewed from a top view direction D3 (shown in the figure), all of the metal members 10030 located in the region A1 extend from an upper left position to a lower right position, respectively; all of the metal members 10030 located in the region A3 extend from a lower left position to an upper right position, respectively; all of the metal members 10030 located in the region A6 extend from an upper right position to a lower left position, respectively; and all of the metal members 10030 located in the region A8 extend from a lower right position to an upper left position, respectively; and all of the metal members 10030 located in the region A2 and the region A7 extend in a first direction D1, respectively; and all of the metal members 10030 located in the region A4 and the region A5 extend in a second direction D2, respectively. However, the disclosure is not limited thereto.

To sum up, in one or more embodiments of the disclosure, the metal layer surrounds the periphery of the bonding pad. During an LLO process, the metal layer may prevent a laser beam from irradiating the thin film transistor, thereby maintaining electrical performance of the thin film transistor and reliability of the entire display device. In addition, reflective properties of the metal layer help increase light utilization. In an embodiment, the reflectance of the metal layer may be less than 30%, to facilitate outdoor application. In another embodiment, the distance between the metal layer and the bonding pad may range from 1 μm to 30 μm, so as to ensure both electrical performance and light shielding performance.

Although the embodiments and the advantages have been disclosed above, it should be understood that any person with ordinary skill in the pertinent art may make changes, substitutions, and refinements without departing from the spirit and scope of the disclosure. In addition, the scope of protection provided in the disclosure is not limited to the processes, machine, fabrications, compositions of substances, devices, methods, and steps provided in one or more embodiments described herein. People having ordinary skill in the pertinent art are able to understand the processes, machine, fabrications, compositions of substances, devices, methods, and steps provided in one or more embodiments developed at present or in the future, as long as the same function can be performed or the same result can be achieved according to the embodiments described in the disclosure. Accordingly, the scope of protection of the disclosure includes the above-mentioned processes, machine, fabrications, compositions of substances, devices, methods, and steps. In addition, each claim constitutes an individual embodiment, and the scope of the disclosure also includes the combination of the various claims and embodiments. The scope of protection of the disclosure is subject to what is defined in the appended claims. Any embodiment or claim of the disclosure is not required to achieve all the objectives, advantages, or features disclosed herein.

What is claimed is:

1. A display device, comprising:
a substrate; and
a plurality of pixels disposed on the substrate, wherein at least one of the plurality of pixels comprises:
a thin film transistor;
a bonding pad electrically connected to the thin film transistor;
a light emitting unit disposed on the bonding pad; and
a metal layer insulated from the bonding pad and surrounding the bonding pad in a top view direction of the display device, wherein the metal layer comprises a plurality of separated metal members adjacent to the bonding pad.

2. The display device according to claim 1, wherein a distance between the metal layer and the bonding pad ranges from 1 μm to 30 μm.

3. The display device according to claim 1, wherein the plurality of separated metal members are arranged in form of at least one ring with the light emitting unit as a center.

4. The display device according to claim 1, wherein the at least one of the plurality of pixels is divided into a plurality of regions with the light emitting unit as a center, and the plurality of separated metal members are located in the plurality of regions and extend inward with the light emitting unit as a center, wherein an acute angle between extending directions of two adjacent metal members of the plurality of separated metal members located in a same region of the plurality of regions is less than 10 degrees.

5. The display device according to claim 1, wherein the plurality of separated metal members have a same shape.

6. The display device according to claim 1, wherein at least some of the plurality of separated metal members have different shapes.

7. The display device according to claim 1, wherein the metal layer and the bonding pad are formed in a same layer.

8. The display device according to claim 1, wherein the metal layer and the bonding pad are formed in different layers.

9. The display device according to claim 1, wherein a reflectance of the metal layer is less than 30%.

10. The display device according to claim 1, wherein the display device is a flexible electronic device, a touch electronic device, a curved electronic device, or a non-rectangular electronic device.

11. The display device according to claim 1, wherein the bonding pad comprises a reflective electrode, a transparent electrode, or a translucent electrode.

12. The display device according to claim 1, wherein the light emitting unit comprises an organic light emitting diode module, a quantum dot light emitting diode module, or a light emitting diode module.

13. The display device according to claim 12, wherein the light emitting diode module comprises a micro light emitting diode or a mini light emitting diode.

14. The display device according to claim 1, wherein the metal layer further comprises a peripheral metal member adjacent to and separated from the separated metal members, wherein the separated metal members are located between the peripheral metal member and the bonding pad, and the peripheral metal member continuously forms a closed ring.

15. The display device according to claim 1, wherein the bonding pad and the metal layer are located between the thin film transistor and the light emitting unit in the top view direction.

16. The display device according to claim 1, wherein an area of the bonding pad is less than an area of the light emitting unit in the top view direction.

17. The display device according to claim 1, wherein the metal layer is located between the thin film transistor and the bonding pad.

18. The display device according to claim 17, wherein the metal layer partially overlaps the bonding pad from the top view direction.

19. The display device according to claim 1, wherein an angle between a side of the light emitting unit and an extension direction of each of separated metal members adjacent to the side of the light emitting unit is greater than 0 degrees and less than or equal to 90 degrees.

* * * * *